United States Patent
Heo et al.

(10) Patent No.: US 8,314,440 B2
(45) Date of Patent: Nov. 20, 2012

(54) LIGHT EMITTING DIODE CHIP AND METHOD OF FABRICATING THE SAME

(75) Inventors: Min Chan Heo, Ansan-si (KR); Sang Ki Jin, Ansan-si (KR); Jong Kyu Kim, Ansan-si (KR); Jin Cheol Shin, Seoul (KR); So Ra Lee, Asan-si (KR); Sum Geun Lee, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 13/073,522

(22) Filed: Mar. 28, 2011

(65) Prior Publication Data
US 2012/0161176 A1   Jun. 28, 2012

(30) Foreign Application Priority Data
Dec. 24, 2010   (KR) .......................... 10-2010-0134584

(51) Int. Cl.
  *H01L 33/00* (2010.01)
  *H01L 21/00* (2006.01)
(52) U.S. Cl. ..................... 257/98; 257/E33.067; 438/29

(58) Field of Classification Search .................... 257/13, 257/98, 79, E33.055, 99, E33.001, E33.067; 438/22, 27, 29
See application file for complete search history.

(56) References Cited

U.S. PATENT DOCUMENTS
5,912,915 A * 6/1999 Reed et al. ...................... 372/93
2008/0179605 A1 * 7/2008 Takase et al. .................. 257/94
* cited by examiner

*Primary Examiner* — A. Sefer
*Assistant Examiner* — Nikolay Yushin
(74) *Attorney, Agent, or Firm* — H.C. Park & Associates, PLC

(57) ABSTRACT

Exemplary embodiments of the present invention provide light emitting diode (LED) chips and a method of fabricating the same. An LED chip according to an exemplary embodiment includes a substrate; a light emitting structure arranged on the substrate, and an alternating lamination bottom structure arranged under the substrate. The alternating lamination bottom structure includes a plurality of dielectric pairs, each of the dielectric pairs including a first material layer having a first refractive index and a second material layer having a second refractive index, the first refractive index being greater than the second refractive index.

18 Claims, 3 Drawing Sheets

LIGHT EMITTING DIODE CHIP AND METHOD OF FABRICATING THE SAME

CROSS-REFERENCE TO RELATED APPLICATION

This application claims priority from and the benefit of Korean Patent Application No. 10-2010-0134584, filed on Dec. 24, 2010, which is hereby incorporated by reference for all purposes as if fully set forth herein.

BACKGROUND OF THE INVENTION

1. Field of the Invention

Exemplary embodiments of the present invention relate to a light emitting diode chip and a method of fabricating the same and, more particularly, to a light emitting diode chip having improved luminous efficiency and a method of fabricating the same.

2. Description of the Background

Gallium nitride (GaN)-based blue or ultraviolet (UV) light emitting diodes (LEDs) have been used in a wide range of applications. In particular, various kinds of LED packages for emitting mixed color light, for example, white light, have been applied to backlight units, general lighting, and the like.

Since optical power of the LED package generally depends upon luminous efficiency of an LED chip, numerous studies have focused on development of LED chips having improved luminous efficiency. For example, to improve light extraction efficiency, a rough surface may be formed on a light emitting plane of the LED chip, or the shape of an epitaxial layer or transparent substrate may be adjusted.

Alternatively, a metal reflector such as Al may be disposed on a chip mounting plane opposite to the light emitting plane to reflect light traveling towards the chip mounting plane, which may improve luminous efficiency. Namely, the metal reflector may be used to reflect light and reduce optical loss, improving luminous efficiency. However, reflective metals may suffer from deterioration in reflectivity upon oxidation and the metal reflector may have a relatively low reflectivity.

Accordingly, recent studies have focused on both high reflectivity and relatively stable reflective characteristics of a reflective layer using a laminate of materials having different indices of refraction alternately stacked one above another.

However, such an alternating lamination structure may have high reflectivity in a narrow wavelength band and low reflectivity in other wavelength bands. Accordingly, for an LED package that uses light subjected to wavelength conversion through phosphors or the like to emit white light, the alternating lamination structure may not provide effective reflective characteristics with respect to the light subjected to wavelength conversion and may have limited ability to improve luminous efficiency of the LED package. Further, the alternating lamination structure may exhibit high reflectivity to vertically incident light, but may exhibit relatively low reflectivity to light having a relatively high angle of incidence.

The wavelength band with high reflectivity may be widened by increasing the total number of layers stacked in the alternating lamination structure and adjusting the thickness of each of the layers. However, a large number of layers in the alternating lamination structure may make it difficult to adjust the thickness of each of the layers, and changing the total number of layers may change the thickness of each of the layers, thereby making it difficult to determine an optimal thickness of each of the layers.

SUMMARY OF THE INVENTION

Exemplary embodiments of the present invention provide an LED chip having improved luminous efficiency.

Exemplary embodiments of the present invention provide an LED chip that may improve luminous efficiency of an LED package.

Exemplary embodiments of the present invention provide a light emitting diode chip and a fabrication method thereof, which facilitates determination of an optical thickness of each of the layers and lamination sequence of the layers in an alternating lamination structure.

Additional features of the invention will be set forth in the description which follows, and in part will be apparent from the description, or may be learned by practice of the invention.

An exemplary embodiment of the invention provides a light emitting diode chip including a substrate, a light emitting structure arranged on the substrate, and including a first conductivity type semiconductor layer, a second conductivity type semiconductor layer, and an active layer disposed between the first conductivity type semiconductor layer and the second conductivity type semiconductor layer, and an alternating lamination bottom structure, the substrate arranged on the alternating lamination bottom structure, the alternating lamination bottom structure including a plurality of dielectric pairs, each of which includes a first material layer having a first refractive index and a second material layer having a second refractive index, the first refractive index being greater than the second refractive index. Furthermore, the plurality of dielectric pairs include a plurality of first dielectric pairs including the first material layer and the second material layer, the first material layer and the second material layer each having an optical thickness less than $\lambda/4$; a second dielectric pair including the first material layer and the second material layer, one of the first material layer and the second material layer including an optical thickness less than $\lambda/4$ and the other including an optical thickness greater than $\lambda/4$, and a plurality of third dielectric pairs including the first material layer and the second material layer, each of the first material layer and the second material layer having an optical thickness greater than $\lambda/4$, wherein $\lambda$ is a central wavelength of the visible light range.

Another exemplary embodiment of the invention provides a method of fabricating a light emitting diode chip. The method comprises forming at least one light emitting structure on a first surface of a substrate and forming an alternating lamination bottom structure on a second surface of the substrate, the second surface being on an opposite side of the substrate as the first surface. The alternating lamination bottom structure includes a plurality of dielectric pairs, and each of the dielectric pairs includes a first material layer having a first refractive index and a second material layer having a second refractive index, the first refractive index being greater than the second refractive index. Furthermore, the plurality of dielectric pairs include a plurality of first dielectric pairs including the first material layer and the second material layer, is the first material layer and the second material layer each having an optical thickness less than $\lambda/4$; a second dielectric pair including the first material layer and the second material layer, one of the first material layer and the second material layer having an optical thickness less than $\lambda/4$ and the other having an optical thickness greater than $\lambda/4$, and a plurality of third dielectric pairs including the first material layer and the second material layer, each of the first material layer and the second material layer having an optical thickness greater than λ/4, wherein λ is a central wavelength of the visible light range.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
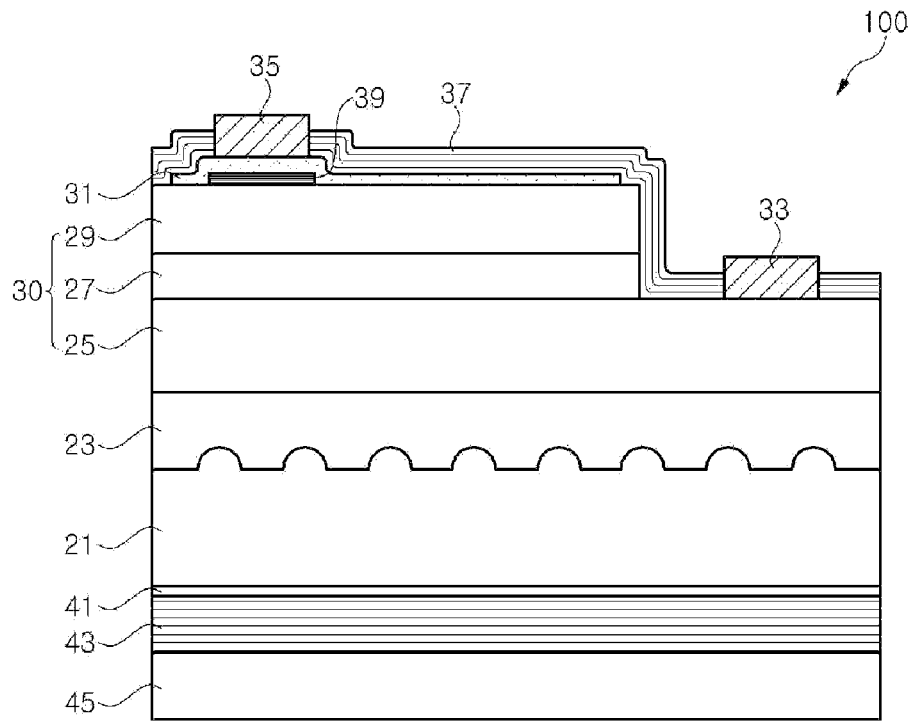
FIG. 1 is a side sectional view of a light emitting diode chip according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough and will fully convey the scope of the invention to those skilled in the art. In the drawings, the sizes and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

FIG. 1 is a side sectional view of a light emitting diode (LED) chip 100 according to an exemplary embodiment of the present invention.

Referring to FIG. 1, the LED chip 100 includes a substrate 21, a light emitting structure 30, an alternating lamination bottom structure 43, an alternating lamination top structure 37, and an alternating lamination under structure 39. The light emitting diode chip 100 may further include a buffer layer 23, a transparent electrode 31, a first electrode pad 33, a second electrode pad 35, an interfacial layer 41, and a metal reflector 45.

The substrate 21 may be selected from any substrate, for example, a sapphire substrate or a SiC substrate. The substrate 21 may have a pattern on an upper surface thereof, as in a patterned sapphire substrate (PSS) having a pattern on an upper surface thereof. The substrate 21 may be a growth substrate suited for growing GaN-based compound semiconductor layers.

The light emitting structure 30 is located on the substrate 21. The light emitting structure 30 includes a first conductivity type semiconductor layer 25, a second conductivity type semiconductor layer 29, and an active layer 27 interposed between the first and second conductivity type semiconductor layers 25 and 29. Herein, the first conductivity type and the second conductivity type refer to opposite conductivity types. For example, the first conductivity type may be n-type and the second conductivity type may be p-type, or vice versa.

The first conductivity type semiconductor layer 25, the active layer 27 and the second conductivity type semiconductor layer 29 may be formed of a GaN-based compound semiconductor material, that is, (Al, In, Ga)N. The active layer 27 may be composed of elements emitting light at desired wavelength, for example, UV or blue light. As shown, the first conductivity type semiconductor layer 25 and/or the second conductivity type semiconductor layer 29 have a single layer structure or a multilayer structure. Further, the active layer 27 may have a single quantum well structure or a multi-quantum well structure. The buffer layer 23 may be interposed between the substrate 21 and the first conductive type semiconductor layer 25.

These semiconductor layers 25, 27 and 29 may be formed by metal organic chemical vapor deposition (MOCVD) or molecular beam epitaxy (MBE), and may be patterned to expose some regions of the first conductive type semiconductor layer 25 by photolithography and etching.

A transparent electrode layer 31 may be formed on the second conductivity type semiconductor layer 29. The transparent electrode layer 31 may be formed of, for example, indium tin oxide (ITO) or Ni/Au. The transparent electrode layer 31 has a lower specific resistance than the second conductivity type semiconductor layer 29 and acts to spread electric current. The first electrode pad 33, for example, an n-electrode pad, is formed on the first conductivity type semiconductor layer 25, and the second electrode pad 35, for example, a p-electrode pad, is formed on the transparent electrode layer 31. As shown, the p-electrode pad 35 may be electrically connected to the second conductivity type semiconductor layer 29 through the transparent electrode layer 31.

The alternating lamination bottom structure 43 is located under the substrate 21. The alternating lamination bottom structure 43 is formed by alternately stacking a first material layer having a first refractive index, for example $TiO_2$ (n: about 2.4), and a second material layer having a second refractive index, for example $SiO_2$ (n: about 1.5). The alternating lamination bottom structure 43 has a plurality of dielectric pairs exhibiting reflectance of 90% or more with respect to incident light, which is emitted from the active layer, at an angle of incidence of 0 degrees-60 degrees. Here, the plurality of dielectric pairs is formed to exhibit high reflectivity at wavelengths in the range of, for example, 400 nm-700 nm.

Figure 2:
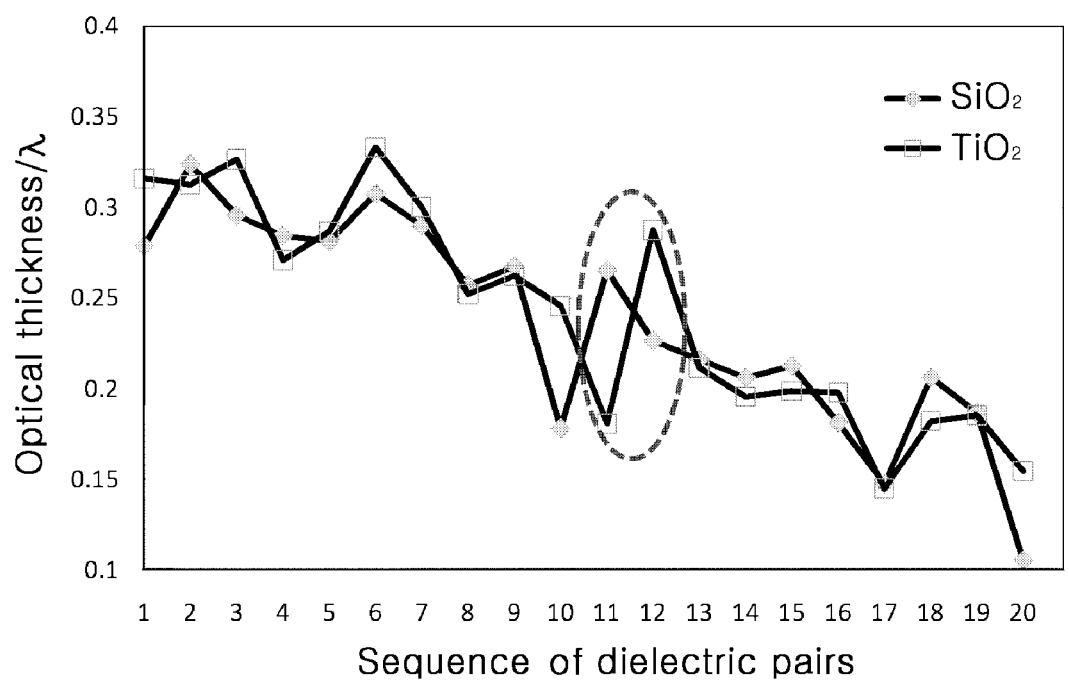
FIG. 2 is a graph explaining optical thickness and sequence of an alternating lamination bottom structure according to the exemplary embodiment of the present invention.

For example, as shown in FIG. 2, the plurality of dielectric pairs include a plurality of first dielectric pairs composed of the first material layer and the second material layer is each having an optical thickness less than λ/4 (0.25λ), at least one second dielectric pair composed of the first material layer and the second material layer, one of which has an optical thickness less than $\lambda/4$ and the other of which has an optical thickness greater than $\lambda/4$, and a plurality of third dielectric pairs composed of the first material layer and the second material layer each having an optical thickness greater than $\lambda/4$, where $\lambda$ is a central wavelength (for example, 550 nm) of the visible light spectrum.

As can be seen from a graph of FIG. 2, the plurality of first dielectric pairs may be located farther from the substrate 21 than the plurality of third dielectric pairs. As shown in FIG. 2, as the sequence of dielectric pairs increases from 1 to 20, the distance from the substrate increases. Alternatively, the plurality of first dielectric pairs may be located closer to the substrate than the plurality of third dielectric pairs.

The at least one second dielectric pair (inside the dotted circle) is disposed near the center of the alternating lamination bottom structure 43. The at least one second dielectric pair may be the $(n/2)^{th}$ layer, wherein n=the total number of layers in the alternating lamination bottom structure 43. However, the at least one second dielectric pair may be within 1 or 2 layers of the center of the alternating lamination bottom structure 43. For example, the second dielectric pairs may be the $11^{th}$ and $12^{th}$ dielectric pairs in the sequence of dielectric pairs, as shown in FIG. 2. With reference to the at least one second dielectric pair, half or more of the first dielectric pairs may be located opposite to half or more of the third dielectric pairs. 80% or more of the first dielectric pairs may be located opposite to 80% or more of the third dielectric pairs with reference to the at least one second dielectric pair. In FIG. 2, the total number of dielectric pairs is 20, the number of first dielectric pairs is 9, the number of third dielectric pairs is 9, and the number of second dielectric pairs is 2. However, any combination of dielectric pairs is possible.

The at least one second dielectric pair may be surrounded by first dielectric pairs, as shown in FIG. 2. However, the present invention is not limited thereto. Alternatively, the at least one second dielectric pair may be surrounded by third dielectric pairs, or by one first dielectric pair and one second dielectric pair.

A small number of third dielectric pairs may be interposed between the second dielectric pair and most of the first dielectric pairs, and a small number of first dielectric pairs may be interposed between the second dielectric pair and most of the third dielectric pairs.

Figure 3:
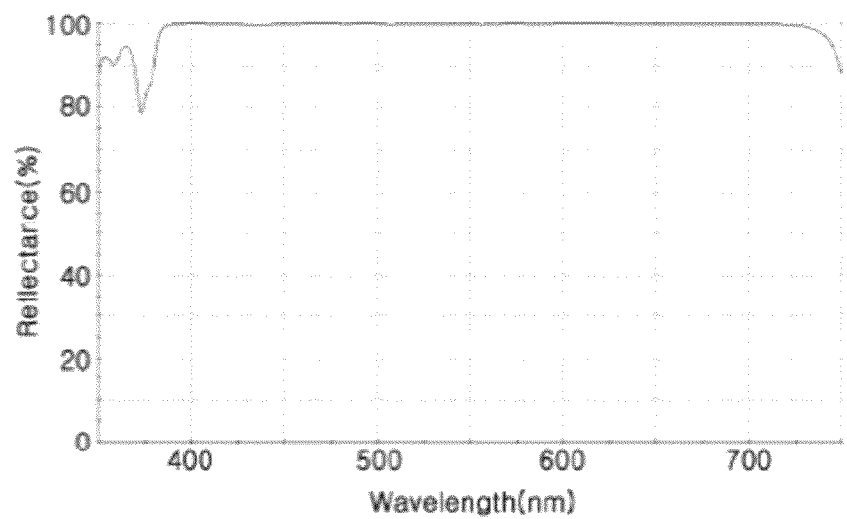
FIG. 3 is a graph depicting reflectance of the alternating lamination bottom structure of FIG. 2.

FIG. 3 illustrates a simulation result of reflectance when the plurality of dielectric pairs of FIG. 2 is disposed on a glass substrate (n: ~1.5). In FIG. 3, the plurality of dielectric pairs are stacked as illustrated in FIG. 2, in which the first layer (i.e., the layer closest to the substrate) is $TiO_2$ and the last layer is $SiO_2$.

As shown in FIG. 3, the plurality of dielectric pairs exhibit a high reflectance of 98% or more in a wide range of the visible light range of 400 nm-700 nm. This high reflectance may be maintained for blue light (for example, 460 nm) generated in the active layer 27 even though the angle of incidence of blue light approaches 60 degrees.

In addition, as shown in FIG. 1, the metal reflector 45 may be disposed under the alternating lamination bottom structure 43, so that the high reflectance of the plurality of dielectric pairs may be maintained to 90% or more with respect to incident light having an angle of incidence of 0 degrees-60 degrees by a combination of the metal reflector 45 and the alternating lamination bottom structure 43. The metal reflector 45 may help to effectively dissipate heat generated by the LED during operation of the LED chip 100.

The alternating lamination bottom structure 43 may be formed on a lower surface is of the substrate 21 which has the light emitting structure 30 formed thereon. The alternating lamination bottom structure 43 may be formed using, for example, an ion-assisted deposition apparatus. Before using the deposition apparatus, the optical thicknesses and lamination sequence of the respective layers in the alternating lamination bottom structure 43 may be determined.

The optical thicknesses and lamination sequence of the respective layers in the alternating lamination bottom structure 43 may be determined using a simulation tool. However, since the simulation tool may not be sufficient to determine a proper number of dielectric pairs having a high reflectance of 98% or more, an additional operation, for example, addition of a dielectric pair, may be performed to increase the total number of dielectric pairs and the reflectance of the dielectric pairs. Since the entire optical thickness of the dielectric pairs may be changed according to the position and optical thickness of an added single dielectric pair, it may be difficult to determine the position and the optical thickness, and a desired optical thickness may be changed.

According to the exemplary embodiments of the present invention, the plurality of dielectric pairs are divided into the first dielectric pairs, the second dielectric pairs, and the third dielectric pairs, such that the second dielectric pairs are located near the center of the alternating lamination bottom structure 43 with the plurality of first dielectric pairs separated from the third dielectric pairs, thereby facilitating determination of the optical thicknesses and lamination sequence of the respective layers in the structure. For example, when the plurality of first dielectric pairs is located farther from the substrate 21 than the second dielectric pairs, if a dielectric pair to be added pertains to the first dielectric pairs, the position of the added dielectric pair can be determined in the plurality of first dielectric pairs. As a result, the optical thicknesses and lamination sequence of the plurality of dielectric pairs may be easily determined.

Since the plurality of dielectric pairs may be formed using the ion-assisted deposition apparatus, the layers may be formed in a comparatively high density, resulting in the generation of stress between the substrate 21 and the alternating laminated bottom structure 43. Thus, an interfacial layer 41 may be formed in order to enhance adhesion of the alternating laminated bottom structure 43 to the substrate 21 before the formation of the alternating laminated bottom structure 43. The interfacial layer 41 may be formed of the same material as the alternating laminated bottom structure 43, for example, $SiO_2$.

Referring again to FIG. 1, the alternating lamination top structure 37 is disposed on the light emitting structure 30. As shown, the alternating laminated top structure 37 may cover the transparent electrode layer 31 and an exposed surface of the first conductive type semiconductor layer 25.

The alternating laminated top structure 37 allows transmission of light generated in the active layer 27 therethrough while reflecting light entering the light emitting diode chip 100, for example, light emitted from phosphors. Accordingly, the alternating laminated top structure 37 allows short wavelength blue light or UV light generated in the active layer 27 to pass therethrough, and reflects green to red light, particularly, yellow light.

Figure 4:
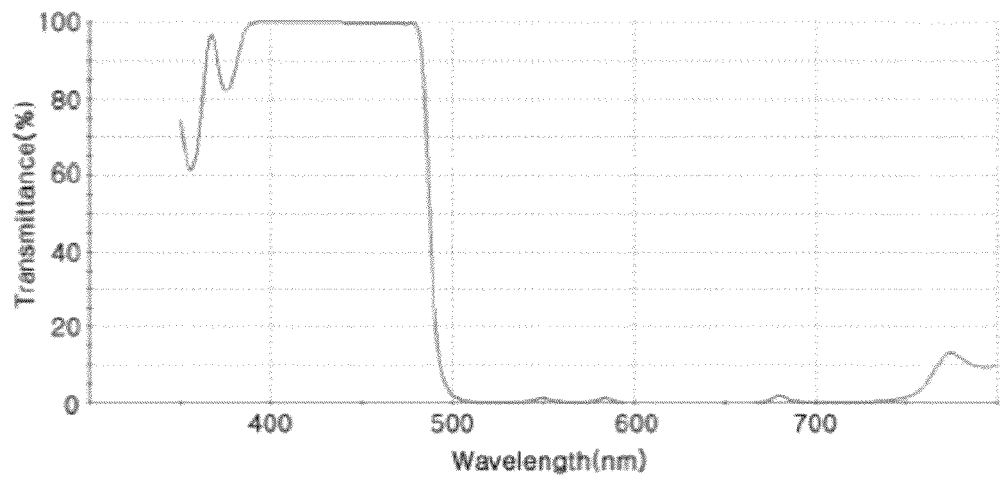
FIG. 4 is a graph depicting transmittance of an alternating lamination top structure according to an exemplary embodiment of the present invention.

FIG. 4 is a graph depicting simulated transmittance of the alternating laminated top structure 37 formed by alternately stacking $TiO_2$ and $SiO_2$. In this simulation, the alternating laminated top structure 37 has 14 $TiO_2$ layers and 14 $SiO_2$ layers alternately stacked on a glass substrate. As shown in FIG. 4, by controlling the optical thicknesses of the $TiO_2$ layer and the SiO$_2$ layer, the alternating laminated top structure 37 exhibits a high transmittance of 98% or more with respect to near UV light or blue light having a wavelength less than 500 nm, while is reflecting light having a wavelength of about 500 nm or more. Accordingly, the alternating laminated top structure 37 may allow transmission of light emitted from the active layer 27 while reflecting light in wavelength bands of green to yellow emitted from the phosphors.

The alternating laminated top structure 37 may also cover a mesa-sidewall and an upper surface of the light emitting diode chip 100 except for upper surfaces of the electrode pads 33, 35 to protect the light emitting diode chip 100.

The alternating lamination under structure 39 is located between the electrode pad 35 and the second conductivity type semiconductor layer 29. The alternating lamination under structure 39 may be located under the transparent electrode 31, but is not limited thereto. The alternating lamination under structure 39 may be located on the transparent electrode 31. When the alternating lamination under structure 39 is located between the transparent electrode 31 and the electrode pad 35, the electrode pad 35 may be electrically connected to the transparent electrode 31 through an extended portion of the electrode pad 35 (not shown).

The alternating lamination under structure 39 reflects light emitted from the active layer 27 and directed towards the electrode pad 35. The alternating lamination under structure 39 is formed to exhibit high reflectivity with respect to light emitted from the active layer 27, and may be formed by alternately stacking, for example, a TiO$_2$ layer and an SiO$_2$ layer. With this configuration, the alternating lamination under structure 39 may prevent optical loss caused by absorption of light by the electrode pad 35, thereby improving luminous efficiency.

Figure 5:
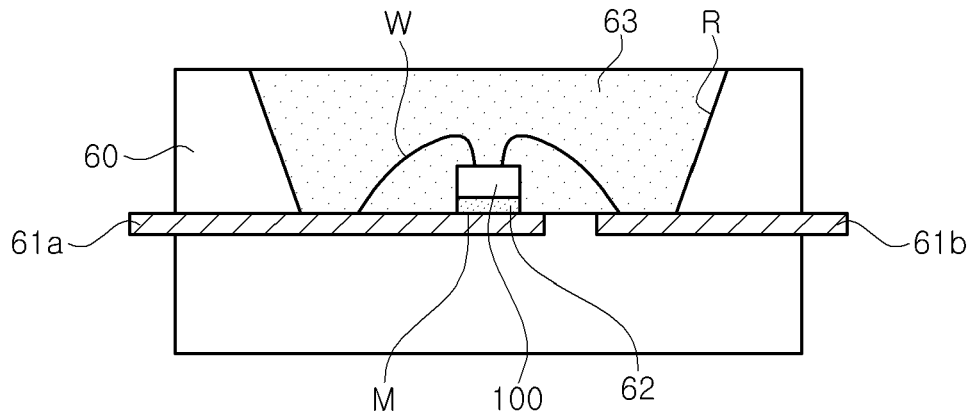
FIG. 5 is a side sectional view of an LED package including an LED chip according to an exemplary embodiment of the present invention.

FIG. 5 is a side sectional view of an LED package including an LED chip 100 according to an exemplary embodiment of the present invention.

Referring to FIG. 5, the LED package includes a package body 60, leads 61a and 61b, the light emitting diode chip 100, and a molding part 63. The package body 60 may be formed of a plastic resin.

The package body 60 has a mounting plane M for mounting the LED chip 100 and a reflection plane R, from which light emitted from the LED chip 100 is reflected. The LED chip 100 is mounted on the mounting plane M and is electrically connected to the leads 61a, 61b via bonding wires W. The LED chip 100 may be bonded to the mounting plane M by adhesives 62, which may be formed by curing, for example, Ag epoxy pastes.

As described with reference to the embodiment shown in FIG. 1, the LED chip 100 may include an alternating lamination bottom structure 43, an alternating lamination top structure 37, an alternating lamination under structure 39 and/or a metal reflector 45.

The LED package emits light having mixed colors, for example, white light. Accordingly, the LED package may include phosphors for wavelength conversion of light emitted from the LED chip 100. The phosphors may be disposed in the molding part 63, but are not limited thereto.

The alternating lamination bottom structure 43 and the alternating lamination under structure 39 of the LED chip 100 provide high efficiency in emission of light generated in the active layer 27. Further, the alternating lamination top structure 37 of the LED chip 100 may reflect light when the light subjected to wavelength conversion by the phosphors again enters the LED chip 100. Accordingly, the LED package of the present exemplary embodiment has higher luminous efficiency than conventional LED packages.

In the present exemplary embodiment, the package is described as including the light emitting diode chip 100 and the phosphors to emit white light, but the present invention is not limited thereto. Various LED packages for emitting white light are known in the art and the LED chip 100 according to the present exemplary embodiment may be applied to any LED package.

Figure 6:
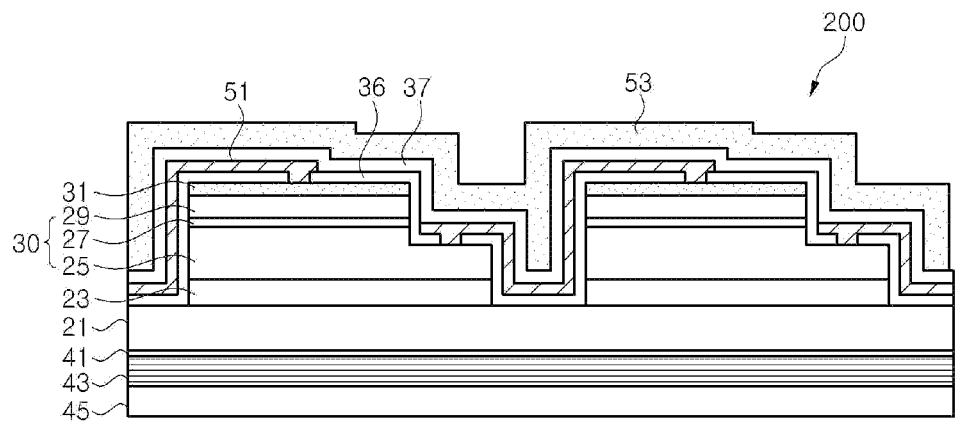
FIG. 6 is a side sectional view of a light emitting diode chip according to an exemplary embodiment of the present invention.

FIG. 6 is a side sectional view of a light emitting diode chip according to an exemplary embodiment of the present invention.

Referring to FIG. 6, an LED chip 200 includes a plurality of light emitting structures 30 on a substrate 21, an alternating lamination bottom structure 43, a metal reflector 45, and an alternating lamination top structure 37.

In the present exemplary embodiment, the substrate 21 and the alternating lamination bottom structure 43 are the same as those of the LED chip described with reference to FIG. 1 and a detailed description thereof will thus be omitted herein. In the present exemplary embodiment, the substrate 21 may be an insulator, for example, a patterned sapphire substrate, for electrical isolation between the plurality of light emitting cells.

The light emitting structures 30 are separated from each other. Each of the light emitting structures 30 have the same configuration as that of the light emitting structure 30 described with reference to the exemplary embodiment shown in FIG. 1, and a detailed description thereof will be omitted herein. Further, buffer layers 23 may be interposed between the light emitting structures 30 and the substrate 21, which may be separated from each other.

A first dielectric layer 36 covers the overall surface of the light emitting structures 30. The first dielectric layer 36 has openings on first conductivity type semiconductor layers 25 and on second conductivity type semiconductor layers 29. Sidewalls of the light emitting structures 30 are covered by the first dielectric layer 36. The first dielectric layer 36 also covers regions of the substrate 21 between the light emitting structures 30. The first dielectric layer 36 may be formed of silicon oxide (SiO$_2$) or silicon nitride by plasma chemical vapor deposition at 200° C.-300° C.

Wires 51 are formed on the first dielectric layer 36. The wires 51 are electrically connected to the first conductivity type semiconductor layers 25 and the second conductivity type semiconductor layers 29 through the openings. Transparent electrode layers 31 may be located on the second conductivity type semiconductor layers 29 and the wires may be connected to the transparent electrode layers 31. Further, the wires 51 electrically connect the first conductivity type semiconductor layers 25 and the second conductivity type semiconductor layers 29 to each other in the adjacent light emitting cells 30 to form a serial array of the light emitting structures 30. The LED chip 200 may have a plurality of serial arrays of light emitting cells. These serial arrays may be connected in reverse-parallel to each other and may be operated by an AC power source. Further, a bridge rectifier (not shown) may be connected to the serial array of the light emitting cells such that the light emitting cells may be operated by the bridge rectifier, which is driven by the AC power source. The bridge rectifier may be formed via electric connection of light emitting cells having the same structure as the light emitting structures 30 using the wires 51.

Alternatively, the wires 51 may connect the first conductivity type semiconductor layers 25 or the second conductivity type semiconductor layers 29 of the adjacent light emitting cells to each other. Accordingly, the light emitting structures 30 connected in series and in parallel to each other may be provided.

The wires 51 may be formed of a conductive material, for example, metal or polycrystalline silicon such as a doped semiconductor material. In particular, the wires 51 may have a multilayer structure and may include a lower layer of Cr or Ti and an upper layer of Cr or Ti. Further, a metal layer of Au, Au/Ni or Au/Al may be interposed between the lower layer and the upper layer.

The alternating lamination top structure 37 may cover the wires 51 and the first dielectric layer 36. As described above with reference to the embodiment shown in FIG. 1, the alternating lamination top structure 37 allows light emitted from the active layer 27 to pass therethrough while reflecting visible light having a comparatively longer wavelength.

A phosphor layer 53 may be formed on the LED chip 200. The phosphor layer 53 may be a resin layer with phosphors dispersed therein or may be a layer deposited by electrophoresis. The phosphor layer 53 covers the alternating lamination top structure 37 to convert the wavelength of light emitted from the light emitting structures 30. As described with reference to FIG. 5, the phosphor layer 53 may also be provided in a process of preparing an LED package and thus may be omitted from the LED chip 200.

Meanwhile, an alternating lamination under structure may be formed between the wires 51 and the light emitting structures 30 as in FIG. 1.

Figure 7:
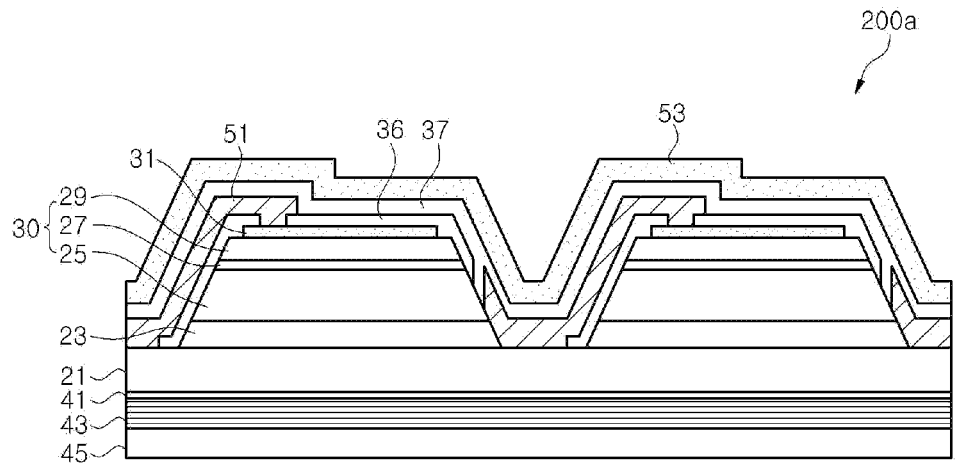
FIG. 7 is a side sectional view of a light emitting diode chip according to an exemplary embodiment of the present invention.

FIG. 7 is a side sectional view of a light emitting diode chip 200a including a plurality of light emitting cells according to an exemplary embodiment of the invention.

Referring to FIG. 7, the LED chip 200a is similar to the LED chip 200 described above in many regards. However, light emitting structures 30 of the light emitting diode chip 200a differ in shape from those of the LED chip 200, thereby providing a different configuration of a first conductivity type semiconductor layer 25 connected to wires 51 from that of the LED chip 200.

Specifically, in the light emitting structures 30 of the LED chip 200, an upper surface of the first conductive type semiconductor layer 25 is exposed and the wire 51 is connected to the upper surface of the first conductive type semiconductor layer 25. In the LED chip 200a of the present exemplary embodiment, the light emitting structures 30 are formed to have slanted side surfaces, so that a slanted side surface of the first conductivity type semiconductor layer 25 is exposed and the wire 51 is connected to the slanted side surface of the first conductivity type semiconductor layer 25.

In the present exemplary embodiment, the process of exposing the upper surface of the first conductivity type semiconductor layer 25 is eliminated except for the process of isolating the light emitting structures 30 from each other, thereby simplifying the process. In addition, since there is no need to expose the upper surface of the first conductivity type semiconductor layer 25, it is possible to prevent a reduction in area of the active layer 27. Further, since the wires 51 are connected along the slanted surface of the first conductivity type semiconductor layer 25, the light emitting structures 30 have enhanced electric current spreading performance, thereby improving forward voltage and reliability.

According to the exemplary embodiments of the present invention, the LED chip includes an alternating lamination bottom structure, a metal reflector, an alternating lamination top structure and/or an alternating lamination under structure, thereby improving luminous efficiency. Further, the alternating lamination top structure of the LED chip allows transmission of light generated in the active layer while reflecting light subjected to wavelength conversion, thereby improving luminous efficiency of an LED package.

In addition, according to the exemplary embodiments of the present invention, a plurality of dielectric pairs each composed of first and second material layers, both of which have an optical thickness less than $\lambda/4$, and a plurality of dielectric pairs each composed of the first and second materials layers, both of which have an optical thickness greater than $\lambda/4$, are disposed with reference to a dielectric pair composed of the first and second material layers, one of which has an optical thickness less than $\lambda/4$ and the other of which has an optical thickness is greater than $\lambda/4$, thereby facilitating determination of the optical thicknesses and lamination sequence of the respective layers in the alternating lamination bottom structure.

Although the invention has been illustrated with reference to some exemplary embodiments in conjunction with the drawings, it will be apparent to those skilled in the art that various modifications and changes can be made to the invention without departing from the spirit and scope of the invention. Therefore, it should be understood that the embodiments are provided by way of illustration only and are given to provide complete disclosure of the invention and to provide thorough understanding of the invention to those skilled in the art. Thus, it is intended that the invention covers the modifications and variations provided they fall within the scope of the appended claims and their equivalents.

What is claimed is:

1. A light emitting diode (LED) chip, comprising:
    a substrate;
    a light emitting structure arranged on the substrate, the light emitting structure comprising a first conductivity type semiconductor layer, a second conductivity type semiconductor layer, and an active layer disposed between the first conductivity type semiconductor layer and the second conductivity type semiconductor layer; and
    an alternately laminated bottom structure disposed on the substrate and comprising dielectric pairs, each of the dielectric pairs comprising a first material layer having a first refractive index and a second material layer having a second refractive index, the first refractive index being greater than the second refractive index, the dielectric pairs comprising:
        first dielectric pairs each comprising the first material layer and the second material layer, the first material layer and the second material layer each having an optical thickness less than $\lambda/4$;
        a second dielectric pair comprising the first material layer and the second material layer, one of the first material layer and the second material layer having an optical thickness less than $\lambda/4$ and the other having an optical thickness greater than $\lambda/4$; and
        third dielectric pairs comprising the first material layer and the second material layer, each of the first material layer and the second material layer having an optical thickness greater than $\lambda/4$,
        wherein $\lambda$ is a central wavelength of the visible light range, and
        wherein the first dielectric pairs are located closer to or farther from the substrate than the third dielectric pairs.

2. The LED chip of claim 1, wherein the second dielectric pair separates the first dielectric pairs and the third dielectric pairs.

3. The LED chip of claim 1, wherein at least half the first dielectric pairs are arranged closer to the substrate than the second dielectric pair, at least half the third dielectric pairs are located farther from the substrate than the second dielectric pair.

4. The LED chip of claim 1, wherein at least 80% of the first dielectric pairs are located closer to the substrate than the second dielectric pair, and at least 80% of the third dielectric pairs are located farther from the substrate than the second dielectric pair.

5. The LED chip of claim 1, wherein the first dielectric pairs are arranged closer to the substrate than the third dielectric pairs.

6. The LED chip of claim 1, wherein at least half the third dielectric pairs are arranged closer to the substrate than the second dielectric pair, and at least half the first dielectric pairs are arranged farther from the substrate than the second dielectric pair.

7. The LED chip of claim 1, wherein the first dielectric pairs are located farther from the substrate than the third dielectric pairs.

8. A light emitting diode (LED) chip, comprising:
a substrate;
a light emitting structure arranged on the substrate, the light emitting structure comprising a first conductivity type semiconductor layer, a second conductivity type semiconductor layer, and an active layer disposed between the first conductivity type semiconductor layer and the second conductivity type semiconductor layer;
an alternately laminated bottom structure disposed on the substrate and comprising dielectric pairs, each of the dielectric pairs comprising a first material layer having a first refractive index and a second material layer having a second refractive index, the first refractive index being greater than the second refractive index, the dielectric pairs comprising:
first dielectric pairs each comprising the first material layer and the second material layer, the first material layer and the second material layer each having an optical thickness less than $\lambda/4$;
a second dielectric pair comprising the first material layer and the second material layer, one of the first material layer and the second material layer having an optical thickness less than $\lambda/4$ and the other having an optical thickness greater than $\lambda/4$; and
third dielectric pairs comprising the first material layer and the second material layer, each of the first material layer and the second material layer having an optical thickness greater than $\lambda/4$,
wherein $\lambda$ is a central wavelength of the visible light range; and
an alternately laminated top structure arranged on the light emitting structure, the alternately laminated top structure configured to transmit light generated in the active layer and to reflect light within at least a portion of the visible light spectrum, the reflected light having a longer wavelength than light generated in the active region.

9. The LED chip of claim 8, wherein the alternately laminated top structure has a transmittance of at least 90% with respect to light generated in the active layer.

10. The LED chip of claim 9, further comprising:
an electrode pad electrically connected to the second conductivity type semiconductor layer; and
an alternately laminated under structure disposed between the second conductivity type semiconductor layer and the electrode pad and configured to reflect light generated in the active layer.

11. The LED chip of claim 10, further comprising a metal reflector disposed on the alternately laminated bottom structure.

12. The LED chip of claim 11, wherein the alternately laminated bottom structure or a combination of the alternately laminated bottom structure and the metal reflector has a reflectance of at least 90%, with respect to light generated in the active layer and that enters the alternately laminated bottom structure at an angle of incidence of from 0 degrees to 60 degrees.

13. A method of fabricating a light emitting diode chip, the method comprising;
forming at least one light emitting structure on a first surface of a substrate; and
forming an alternately laminated bottom structure on an opposing second surface of the substrate, the alternately laminated bottom structure comprising dielectric pairs, each of the dielectric pairs comprising a first material layer comprising a first refractive index and a second material layer comprising a second refractive index, the first refractive index being greater than the second refractive index, the dielectric pairs comprising:
first dielectric pairs comprising the first material layer and the second material layer, the first material layer and the second material layer each having an optical thickness less than $\lambda/4$;
a second dielectric pair comprising the first material layer and the second material layer, one of the first material layer and the second material layer having an optical thickness less than $\lambda/4$ and the other having an optical thickness greater than $\lambda/4$; and
third dielectric pairs comprising the first material layer and the second material layer, each of the first material layer and the second material layer having an optical thickness greater than $\lambda/4$,
wherein $\lambda$ is a central wavelength of the visible light range, and
wherein the first dielectric pairs are located closer to or farther from the substrate than the third dielectric pairs.

14. The method of claim 13, wherein forming the alternately laminated bottom structure comprises determining an optical thickness of each layer in the dielectric pairs and a lamination sequence of the dielectric pairs, and sequentially forming the respective layers on the substrate according to the lamination sequence.

15. The method of claim 13, wherein the second dielectric pair is arranged near the center of the alternately laminated bottom structure.

16. The method of claim 13, wherein at least half the first dielectric pairs are located closer to the substrate than a second dielectric pair located closest to the substrate and such that at least half the third dielectric pairs are located farther from the substrate than a second dielectric pair farthest from the substrate.

17. The method of claim 13, wherein at least half the third dielectric pairs are located closer to the substrate than a second dielectric pair located closest to the substrate such that at least half the first dielectric pairs are located farther from the substrate than a second dielectric pair located farthest from the substrate.

18. The method of claim 13, further comprising forming an alternately laminated top structure on the light emitting structure, the alternately laminated top structure configured to transmit light generated in the active layer and to reflect light within at least a partial region of the visible light spectrum, the reflected light has a longer wavelength than light generated in the active region.

* * * * *